US006695955B2

(12) United States Patent
Hwang et al.

(10) Patent No.: US 6,695,955 B2
(45) Date of Patent: Feb. 24, 2004

(54) METHOD OF FORMING POLYCRYSTALLINE SILICON FOR LIQUID CRYSTAL DISPLAY DEVICE

(75) Inventors: Kwang Jo Hwang, Kyonggi-do (KR); Binn Kim, Seoul (KR); Hae Yeol Kim, Kyonggi-do (KR); Jong Uk Bae, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/140,288

(22) Filed: May 8, 2002

(65) Prior Publication Data

US 2002/0177283 A1 Nov. 28, 2002

(30) Foreign Application Priority Data

May 25, 2001 (KR) ......................................... 2001-28959
Jun. 1, 2001 (KR) ......................................... 2001-30861

(51) Int. Cl.⁷ .............................. C23C 14/34; B05D 3/02
(52) U.S. Cl. .................. 204/192.12; 427/532; 427/593; 427/379; 427/372.2; 427/397.7; 427/383.5; 427/419.1
(58) Field of Search ...................... 204/192.12, 192.15; 427/532, 593, 379, 372.2, 397.7, 383.5, 419.1

(56) References Cited

U.S. PATENT DOCUMENTS

| 6,048,758 A | * | 4/2000 | Yamazaki et al. ........... 438/166 |
| 6,207,481 B1 | * | 3/2001 | Yi et al. ...................... 438/166 |
| 6,500,736 B2 | * | 12/2002 | Kim et al. .................... 438/486 |

FOREIGN PATENT DOCUMENTS

| JP | 08-213327 | 8/1996 | ............ H01L/21/20 |
| KR | 1995-0004553 | 2/1995 | ......... H01L/27/108 |
| KR | 102001-0038202 | 5/2001 | ............ H01L/21/31 |

* cited by examiner

*Primary Examiner*—Steven H. VerSteeg
(74) *Attorney, Agent, or Firm*—Morgan, Lewis & Bockius LLP

(57) ABSTRACT

A method of forming polycrystalline silicon for a liquid crystal display device is disclosed in the present invention. The method includes forming an amorphous silicon layer on a substrate, forming a plurality of catalytic metal clusters on the amorphous silicon layer, forming a catalytic metal gettering layer adjacent to the amorphous silicon layer, and heat-treating the substrate including the amorphous silicon layer to transform the amorphous silicon layer into a polycrystalline silicon layer, wherein unreacted catalytic metal clusters migrate to the catalytic metal gettering layer in a direction perpendicular to the substrate.

22 Claims, 17 Drawing Sheets

METHOD OF FORMING POLYCRYSTALLINE SILICON FOR LIQUID CRYSTAL DISPLAY DEVICE

This application claims the benefit of the Korean Application Nos. P2001-028959 filed on May 25, 2001, and P2001-030861 filed on Jun. 1, 2001, which are hereby incorporated by reference.

BACKGROUND OF THE INVENTION

1. Field of the Invention

The present invention relates to a liquid crystal display device, and more particularly, to a method of forming polycrystalline silicon for a liquid crystal display device.

2. Discussion of the Related Art

A thin film transistor liquid crystal display (TFT-LCD) has been developed to have a high device packing density and a large sized screen, and to form the display part and the driving circuit part on the same substrate. In order to meet the requirements, a mobility of the thin film transistor should be improved. However, it is difficult to enhance the mobility by using an amorphous Si:H thin film transistor (Si:H TFT).

Recently, as a solution for the problem, a polycrystalline silicon TFT (Poly-Si TFT) has been paid much attention. Since the polycrystalline silicon TFT has a great mobility, it has an advantage in that the peripheral circuits can be integrated on the insulating substrate, and a TFT production cost is substantially reduced.

Moreover, as the polycrystalline silicon TFT has a mobility greater than an amorphous silicon TFT, the polycrystalline silicon TFT is favorable for a switching device for a high resolution panel. Also, it is suitable for a projection panel receiving much external light since the polycrystalline silicon TFT has less photo-current unlike the amorphous silicon TFT.

There are many reported methods for forming the polycrystalline silicon. The methods can be sorted as a method for depositing polycrystalline silicon directly and a method for depositing amorphous silicon and crystallizing the amorphous silicon to convert to polycrystalline silicon.

In the former method, there are a low pressure chemical vapor deposition (LPCVD) method, a plasma enhanced chemical vapor deposition (PECVD) method, and the like. The LPCVD method uses expensive silica or quartz as a substrate because the LPCVD method has a high deposition temperature of 550° C. Therefore, the LPCVD method is not suitable for mass production because of the high production cost.

Although the PECVD method is possible to deposit polycrystalline silicon at a temperature below 400° C. by using a mixture gas of $SiF_4/SiH_4/H_2$, it is very difficult to suppress crystalline grains. Moreover, it is known that the PECVD method causes a serious problem in a surface characteristic of a polycrystalline silicon thin film due to non-uniformity in the growth direction in the deposition.

In the latter method (i.e., in the method for depositing amorphous silicon and crystallizing the deposited amorphous silicon), there are a solid phase crystallization (SPC) method, and an excimer laser annealing (ELA) method.

The ELA method, in which a high energy excimer laser beam is directed to an amorphous silicon thin film in a form of pulses to crystallize the thin film in a moment, can form a polycrystalline silicon thin film having large crystalline grains with excellent crystalline characteristics.

However, as the ELA requires the excimer laser, which is an expensive additional equipment, the ELA has limitations in mass production and fabricating a TFT for driving a large sized LCD.

The SPC method, in which an amorphous silicon thin film is crystallized by heating in a furnace, has a slow crystallizing reaction rate because the reaction progresses in a solid state, even if polycrystalline silicon having excellent crystalline characteristics is formed. The SPC method requires a long time of crystallization of a few tens of hours at an elevated temperature higher than 600° C.

Besides the foregoing methods, recently there have been many researches for lowering a crystallizing temperature for using polycrystalline silicon in fabricating a large sized LCD. One of the methods includes a metal induced crystallization (MIC) method. Also, there has been a research for a field effect metal induced crystallization (FEMIC) method.

According to the foregoing methods, it is known that a crystallization temperature of amorphous silicon can be lowered to a temperature below 500° C. if a particular kind of metal is brought into contact with the amorphous silicon.

Causes of the metal induced crystallization vary with different kinds of metals. That is, a crystallization may vary with different metals that are in contact with a-Si:H. For an example, metal induced crystallizations of aluminum (Al), gold (Au), or silver (Ag) are limited by the diffusion of silicon at an interface of the metal with amorphous silicon. That is, the diffusion of the silicon at the interface of the metal with the amorphous silicon forms a silicide phase of a metastable state by a silicon diffusion. Silicide serves to lower a crystallization energy, thereby accelerating the crystallization of silicon.

On the other hand, a metal induced crystallization of nickel (Ni), or titanium (Ti) is controlled by the diffusion of metal caused by annealing at an interface of the metal with the amorphous silicon. That is, the diffusion of the metal at the interface of the metal with the amorphous silicon into a silicon layer forms a silicide phase. Silicide serves to accelerate the crystallization of silicon and drop the crystallization temperature.

A related art method of crystallizing an amorphous silicon film will be explained, with reference to the attached drawings. FIGS. 1A to 1C illustrate schematic cross-sections showing a related art method of crystallizing an amorphous silicon thin film.

Referring to FIG. 1A, an insulating film 102 is formed on an insulating substrate 101 as a buffer layer. An amorphous silicon layer 103 is deposited on the buffer layer 102 as an active region. Then, a catalyst metal thin film 104, serving as a crystallization catalyst, is formed on the amorphous silicon layer 103.

Referring to FIG. 1B, a pair of electrodes 105 are formed on the catalyst metal thin film 104 for applying electric fields.

Then, referring to FIG. 1C, when the electrodes 105 are heat-treated at approximately 500° C., with electric fields applied thereto, clusters of the catalyst metal are diffused toward the amorphous silicon layer 103, resulting in forming silicide $NiSi_2$. The silicide $NiSi_2$ accelerates crystallization of the amorphous silicon 103, thereby crystallizing the amorphous silicon layer 103 into a polycrystalline silicon layer 106 since a crystallization temperature is dropped. That is, amorphous silicon is crystallized by the FEMIC effect.

However, the related art method of forming polycrystalline silicon has the following problems.

Referring to FIG. 1C, there are unreacted metal clusters 104a of the catalyst metal clusters remained on a surface of the polycrystalline silicon formed by crystallization of the amorphous silicon. The remained catalyst metal clusters cause a leakage current in a following process, such as deposition of an insulating film, thereby deteriorating a device performance. That is, when a gate insulating film of the thin film transistor is formed, the catalyst metal remained on the surface of the polycrystalline silicon formed by FEMIC causes a fixed charge at the interface of the polycrystalline silicon and the gate insulating film. The fixed charge deteriorates device performance, such as shifting a threshold voltage of the active region, and increasing an off current Ioff. Moreover, a heat loss is caused at a surface of the amorphous silicon and slows down a crystallization rate. Thus, a point defect is generated in the grain of the polycrystalline silicon after the crystallization.

SUMMARY OF THE INVENTION

Accordingly, the present invention is directed to a method of forming polycrystalline silicon for a liquid crystal display device that substantially obviates one or more of problems due to limitations and disadvantages of the related art.

Another object of the present invention is to provide a method of forming polycrystalline silicon for a liquid crystal display device, which controls an amount of catalytic metal clusters remained in the polycrystalline silicon.

A further object of the present invention is to provide a method of forming polycrystalline silicon for a liquid crystal display device, which minimizes an amount of unreacted catalytic metal remained in the polycrystalline silicon.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming polycrystalline silicon from amorphous silicon includes forming an amorphous silicon layer on a substrate, forming a plurality of catalytic metal clusters on the amorphous silicon layer, forming a catalytic metal gettering layer adjacent to the amorphous silicon layer, and heat-treating the substrate including the amorphous silicon layer to transform the amorphous silicon layer into a polycrystalline silicon layer, wherein unreacted catalytic metal clusters migrate to the catalytic metal gettering layer in a direction perpendicular to the substrate.

According to another aspect of the present invention, a method of forming polycrystalline silicon from amorphous silicon includes forming an amorphous silicon layer on a substrate, forming a plurality of catalytic metal clusters on the amorphous silicon layer, simultaneously applying electric fields to the catalytic metal clusters and first heat-treating the substrate to transform the amorphous silicon layer into a polycrystalline silicon layer, forming a catalytic metal gettering layer on the polycrystalline silicon layer, second heat-treating the substrate including the polycrystalline silicon layer to getter unreacted catalytic metal clusters migrated at the catalytic metal gettering layer, and removing the catalytic metal gettering layer including the unreacted catalytic metal clusters.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

FIGS. 2A to 2D illustrate schematic cross-sections showing a method of forming polycrystalline silicon in accordance with a first embodiment of the present invention. FIGS. 4A to 4E illustrate cross-sections showing a method of fabricating a thin film transistor by using the method of forming polycrystalline silicon in accordance with the first embodiment of the present invention.

In the first embodiment of the present invention, a heavily doped n-type layer (i.e., a phosphorous doped layer) is formed on the surface of amorphous silicon, acting as a catalytic metal gettering layer. A part of nickel clusters used as the catalytic metal in crystallizing the amorphous silicon moves to the heavily doped n-type layer in a vertical direction. Some of the nickel clusters is reacted with the amorphous silicon to form silicide $NiSi_2$. Then, the heavily doped n-layer having unreacted nickel clusters is etched and removed from the substrate.

Figure 1A:
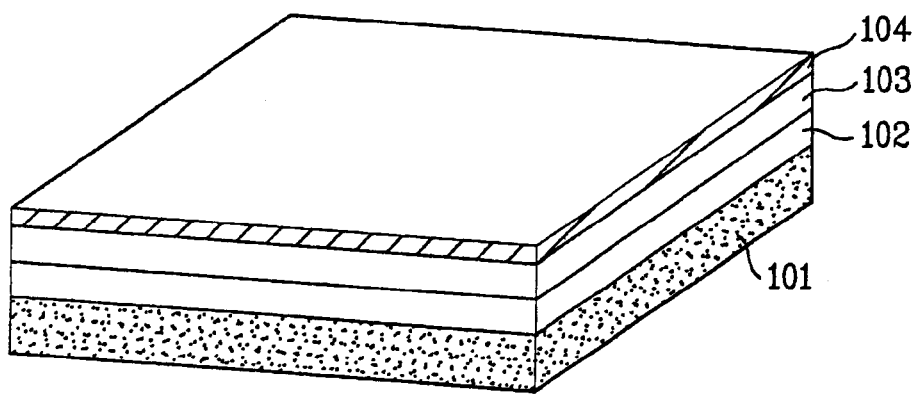
FIGS. 1A to 1C illustrate schematic cross-sections showing a related art method of forming polycrystalline silicon.
Figure 1B:
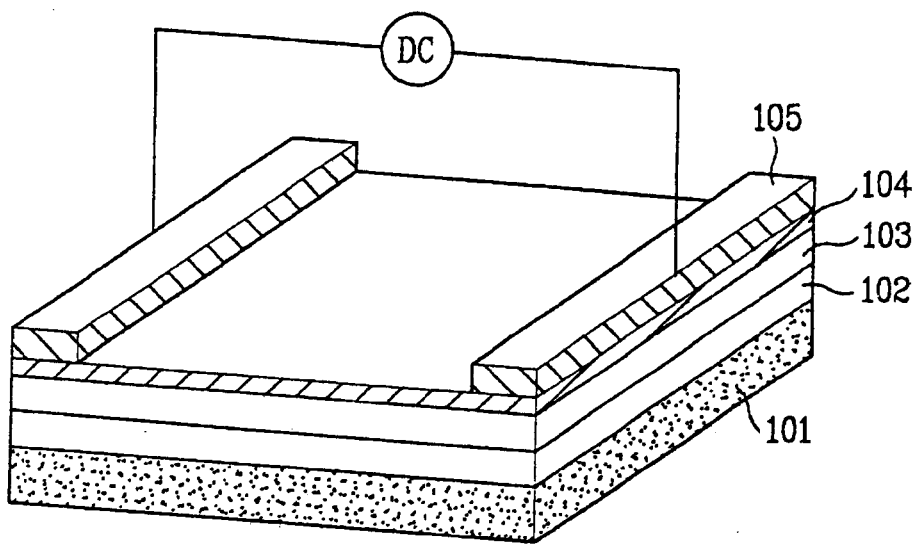
Figure 1C:
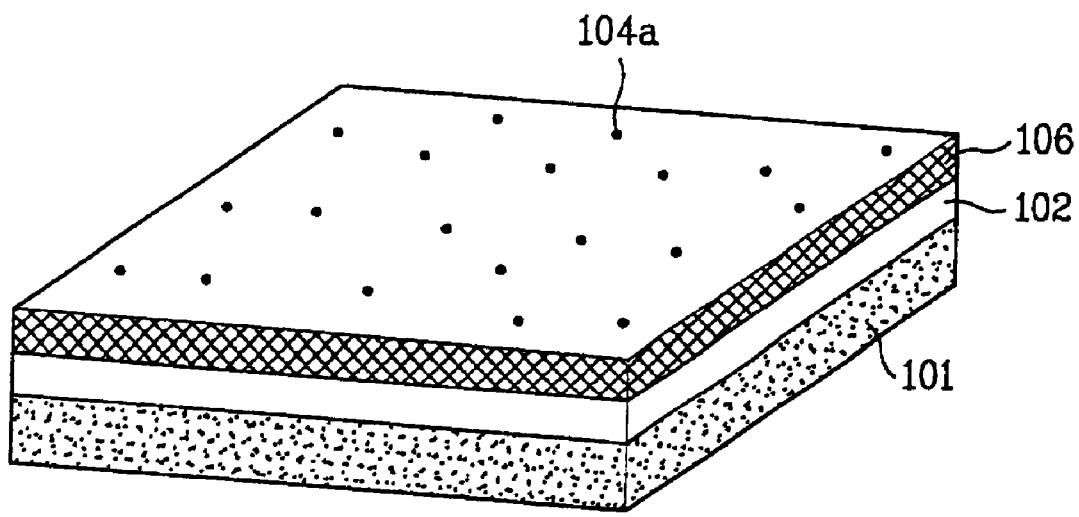
Figure 2A:
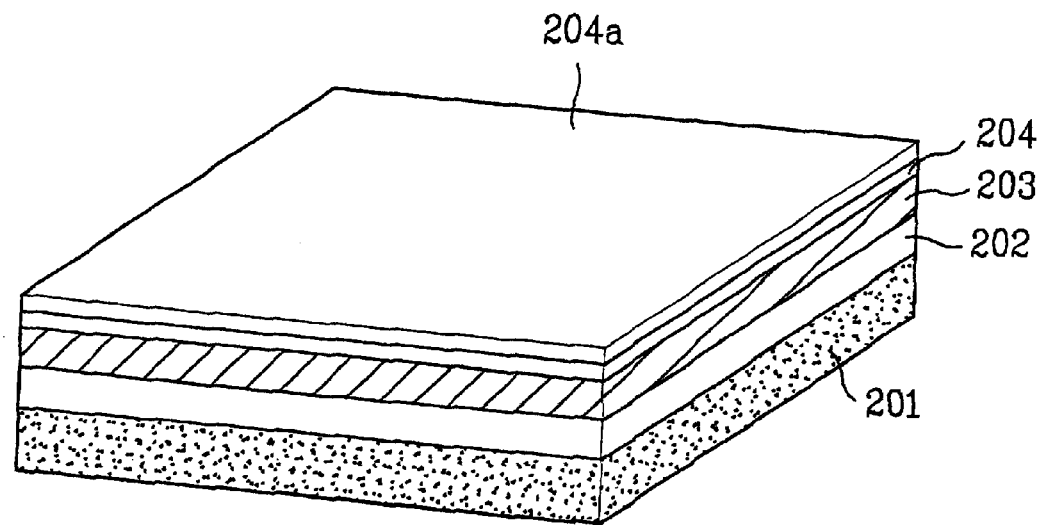
FIGS. 2A to 2D illustrate schematic cross-sections showing a method of forming polycrystalline silicon in accordance with a first embodiment of the present invention.

More particularly, initially referring to FIG. 2A, after a buffer layer 202, such as silicon oxide ($SiO_2$) or silicon nitride ($SiN_2$), is formed on a glass substrate 201 by chemical vapor deposition (CVD), an amorphous silicon (a-Si:H) layer 203 is formed on the buffer layer 202 from a mixture gas of $SiH_4$ and H2 by PECVD.

One side of the buffer layer 202 serves to prevent impurities in the glass substrate 201 from diffusing into the amorphous silicon layer 203. The other side of the buffer layer 202 cuts off a heat flow into the glass substrate 201 in the following crystallization.

Thereafter, a plurality of catalytic metal clusters 204 are formed on the amorphous silicon layer 203 by sputtering. The catalytic metal clusters 204 may be formed of one of chromium (Cr), palladium (Pd), nickel (Ni), and platinum (Pt). For example, a thickness of the catalytic metal clusters is less than a mono-layer, and a concentration of the deposited metal clusters is greater than $1 \times 10^{18}$ atoms/cm$^3$.

A catalytic metal gettering layer 204a is formed on the catalytic metal clusters 204. The catalytic metal gettering layer 204a is formed of amorphous silicon with phosphorous, or n$^+$-type amorphous silicon layer formed from $SiH_4$ and $PH_3$. The catalytic metal gettering layer 204a serves as a sink layer for gettering nickel.

Figure 2B:
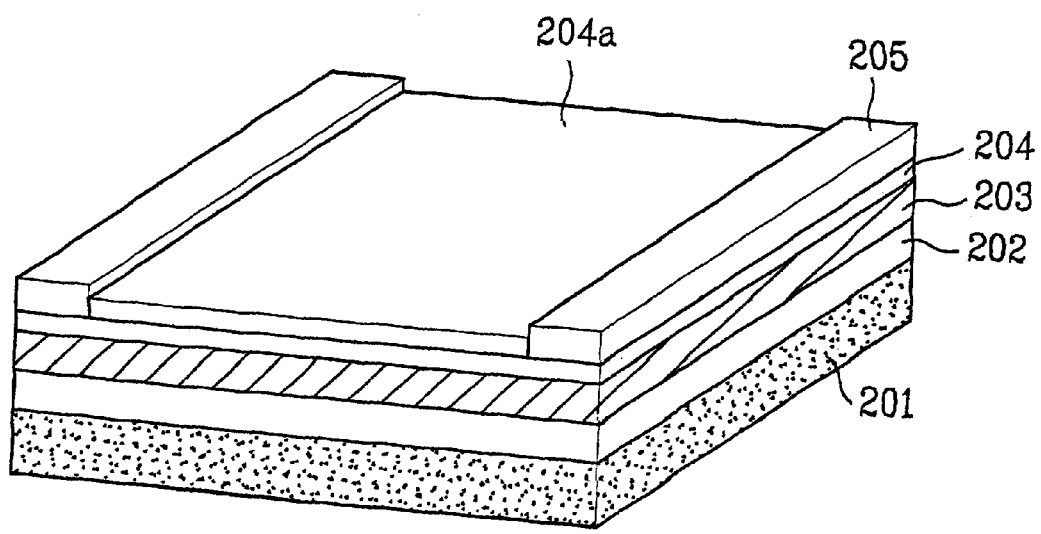

Referring to FIG. 2B, after both ends of the catalytic metal gettering layer 204a are etched to expose the catalytic metal clusters 204, a pair of electrodes 205 are formed thereon for applying electric fields to the exposed catalytic metal clusters 204. The electrodes 205 may be formed of molybdenum or graphite.

Then, electric fields are applied to the electrodes 205 at both ends of the glass substrate, while the glass substrate 201 is annealed to crystallize the amorphous silicon layer 203. For example, a voltage to the electrodes 205 is 10 to 500 V/cm for 15 to 300 min., and an annealing temperature of the glass substrate 201 is 400 to 600° C.

Figure 2C:
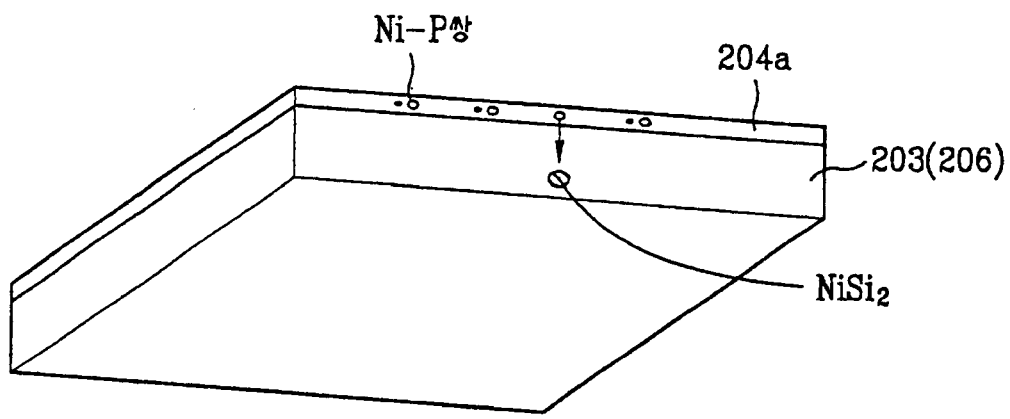
Figure 2D:
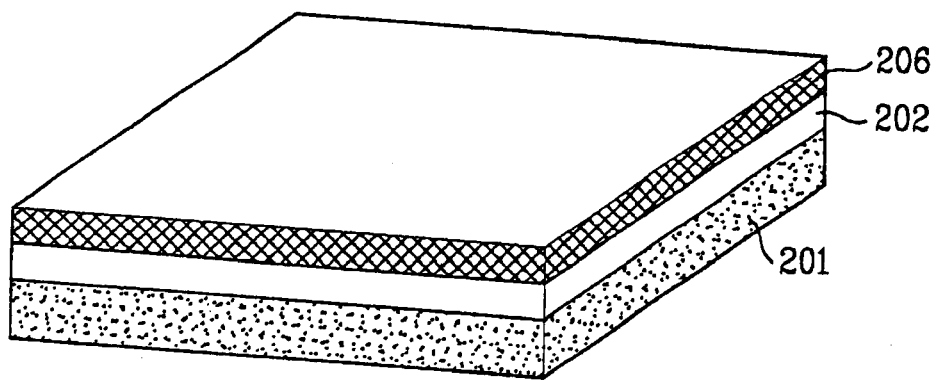

Referring to FIG. 2D, while the foregoing processes are progressed, the amorphous silicon layer 203 is crystallized into a polycrystalline silicon layer 206 by the FEMIC effect.

When annealing is carried out under the foregoing conditions, the catalytic metal clusters 204 in a solid phase diffuse into the amorphous silicon layer 203, to form nuclei forming sites of a metal silicide, and grains of the polycrystalline silicon start to grow. For an example, when nickel (Ni) is used as the catalytic metal clusters 204, nickel silicide $NiSi_2$ is formed by the foregoing process.

That is, the metal silicide serves as a catalyst for crystallizing the amorphous silicon (i.e., crystallization nuclei). Due to the crystallization nuclei, the amorphous silicon is uniformly crystallized at a fast rate.

In the meantime, as shown in FIG. 2C, during the crystallization process, a part of the nickel atoms are diffused toward the catalytic metal gettering layer 204a, to form pairs Ni—P with the phosphorous (P) in the catalytic metal gettering layer 204a.

According to the foregoing reaction, an amount of nickel in the amorphous silicon layer 203 and in the polycrystalline silicon layer 206 and an amount of nickel in the catalytic metal gettering layer are saturated at the concentration equivalent to the nickel solubility at the foregoing crystallization temperature, so that the Ni amount in the polycrystalline silicon is maintained below $1 \times 10^{14}$ atoms/cm$^3$.

Figure 3A:
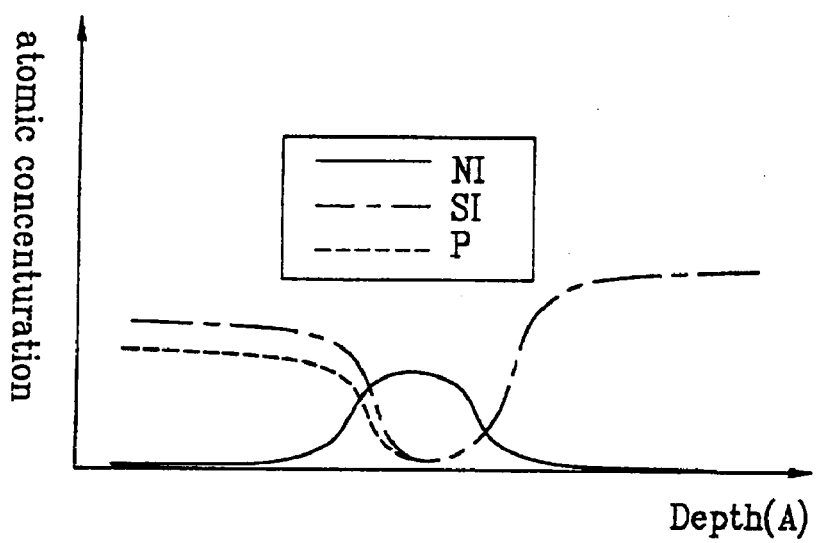
FIG. 3A illustrates a graph showing a nickel diffusion profile in the initial crystallization.
Figure 3B:
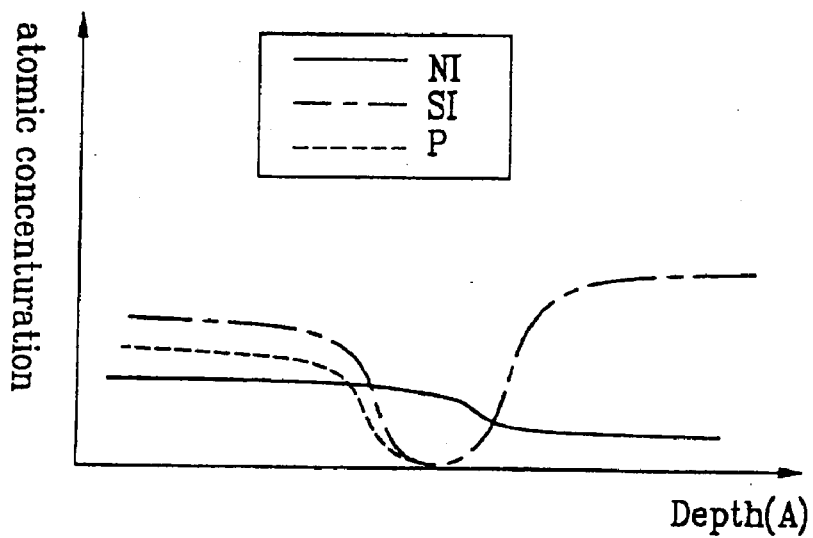
FIG. 3B illustrates a graph showing the nickel diffusion profile in the entire crystallization.

FIG. 3A illustrates a graph showing a nickel diffusion in the initial crystallization, and FIG. 3B illustrates a graph showing the nickel diffusion in the entire crystallization.

Referring to FIGS. 3A and 3B, at the initial crystallization, nickel diffuses to both sides of the amorphous silicon at a fast rate, as shown in FIG. 3A. When the crystallization reaches to the saturation point, nickel atoms in the amorphous silicon in interstitial and substitutional states start to move toward the catalytic metal gettering layer (i.e., the phosphorous doped silicon layer, as shown in FIG. 3B).

When the catalytic metal gettering layer 204a having the nickel diffused thereto is etched and removed, a process for forming polycrystalline silicon by FEMIC is completed. In this instance, amounts of residual nickel and nickel silicide in the polycrystalline silicon layer 206 are substantially smaller than the initially deposited amount.

The method of fabricating a thin film transistor by using the polycrystallization method in accordance with the first embodiment of the present invention will be explained.

Figure 4A:
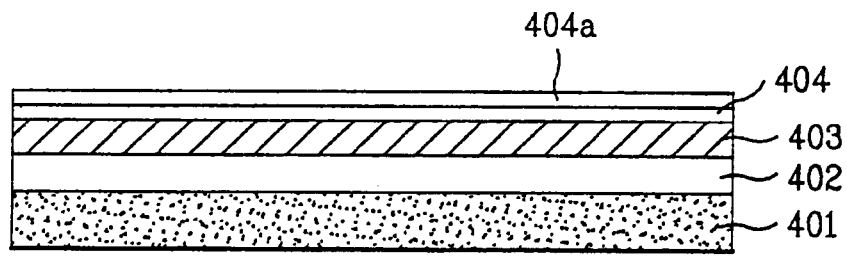
FIGS. 4A to 4E illustrate cross-sections showing a method of fabricating a thin film transistor by using the method of forming polycrystalline silicon in accordance with the first embodiment of the present invention.

Referring to FIG. 4A, a buffer layer 402 of silicon oxide ($SiO_2$) and an amorphous silicon layer (a-Si:H) 403 are formed in succession on a glass substrate 401 by CVD.

Next, catalytic metal clusters 404 are sputtered on the amorphous silicon layer 403. The catalytic metal clusters 404 may be formed of one of chromium (Cr), palladium (Pd), nickel (Ni), and platinum (Pt). For example, a deposition amount of the catalytic metal clusters 404 is higher than $1 \times 10^{18}$ atoms/cm$^3$.

Then, a catalytic metal gettering layer 404a is formed on the catalytic metal clusters 404. The catalytic metal gettering layer 404a is formed of an amorphous silicon with a dopant of phosphorous or an n$^+$-type (heavily doped n-type) amorphous silicon layer formed by using gases, such as $SiH_4$ and $PH_3$.

Figure 4B:
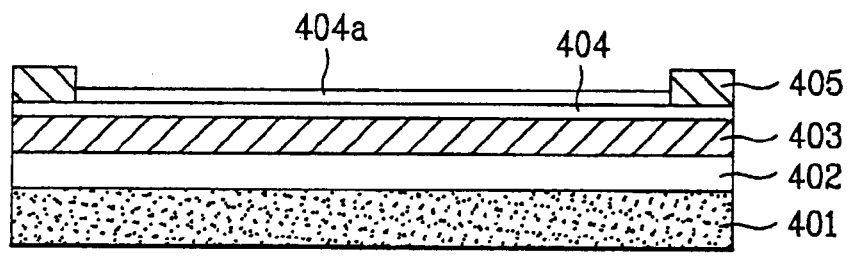

Referring to FIG. 4B, both sides of the catalytic metal gettering layer 404a are etched to expose the catalytic metal clusters 404. A pair of electrodes 405 are added to the exposed catalytic metal clusters 404 for applying electric fields. The electrodes 405 may be formed of molybdenum Mo or graphite.

Thereafter, electric fields are applied to the electrodes 405, while the insulating substrate 401 is heat-treated to crystallize the amorphous silicon layer 403. For example, a voltage to the electrodes 405 may be 10 to 500V/cm for 15 to 300 min., at an annealing temperature of 400 to 600° C.

Figure 4C:
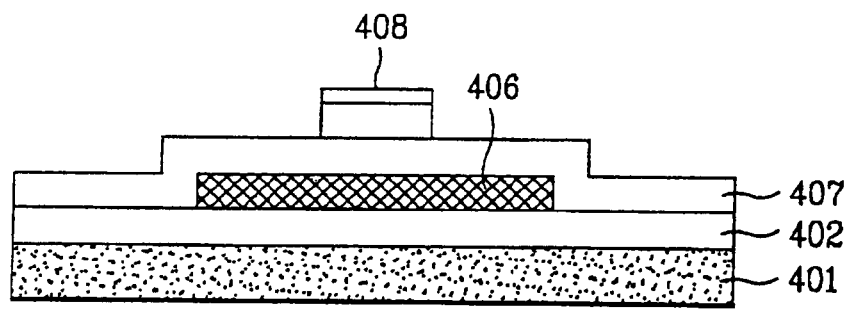

In FIG. 4C, after crystallizing the amorphous silicon layer 403 into a polycrystalline silicon layer 406, the polycrystalline silicon layer 406 is patterned to have an island shape. Then, a gate insulating film 407 is formed of silicon oxide ($SiO_2$) or silicon nitride on the entire surface of the exposed substrate 401, including the polycrystalline silicon layer 406 of the island shape.

AlNd and Mo are stacked on the gate insulating film 407 by sputtering in succession and patterned to form a bilayered gate electrode 408.

Figure 4D:
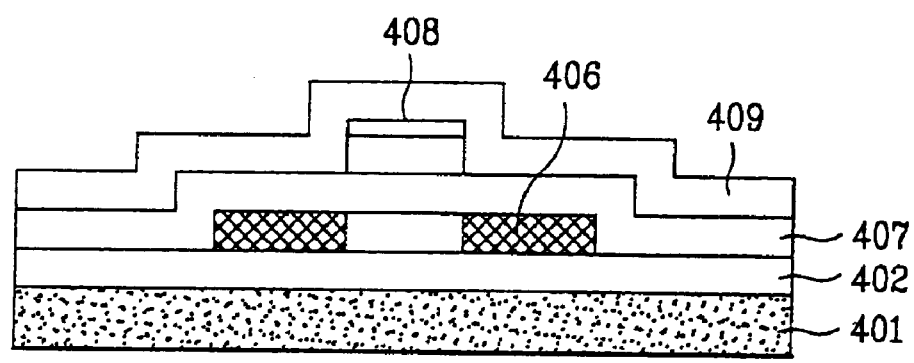

Referring to FIG. 4D, n$^+$-type ions are injected to the polycrystalline silicon layer 406 at both sides of the gate electrode 408 using the gate electrode 408 as a mask to form a source region and a drain region. Then, an active region is enabled at a temperature lower than the crystallization temperature, and an interlayer insulating film 409 is formed on the entire exposed surface of the insulating substrate including the gate electrode 408.

Figure 4E:
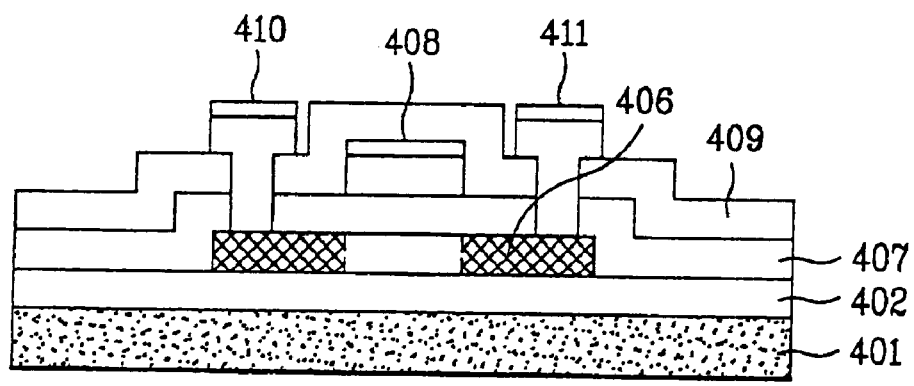

Referring to FIG. 4E, the interlayer insulating film 409 and the gate insulating film 407 are etched to form via-holes so as to expose the source and drain regions of the n$^+$-type ion doped polycrystalline silicon layer 406. AlNd and Mo are stacked in succession to fill the via-holes. Then, the stacked AlNd and Mo are patterned to form a source electrode 410 and a drain electrode 411, thereby completing a process of fabricating a thin film transistor by using the method of forming polycrystalline silicon in accordance with a first embodiment of the present invention.

A method of fabricating a liquid crystal display by using the method of fabricating a thin film transistor and the method of forming polycrystalline silicon in accordance with a first preferred embodiment of the present invention will now be explained. FIGS. 5A to 5F illustrate cross-sections showing a method of fabricating a liquid crystal display by using the method of forming polycrystalline silicon in accordance with the first embodiment of the present invention.

Figure 5A:
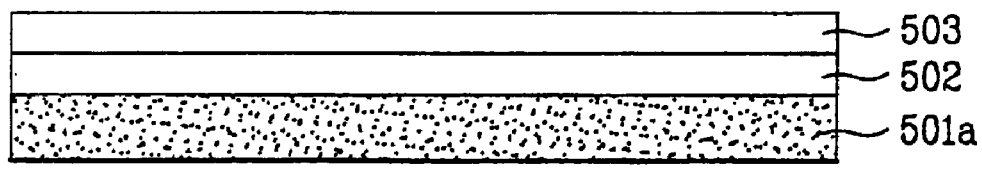
FIGS. 5A to 5F illustrate cross-sections showing a method of fabricating a liquid crystal display device by using the method of forming polycrystalline silicon in accordance with the first embodiment of the present invention.

Initially referring to FIG. 5A, after a buffer layer 502 is formed of silicon oxide on a first substrate 501a, an amorphous silicon layer 503 is formed on the buffer layer 502 by PECVD from a mixture gas of $SiH_4$ and $H_2$. Catalytic metal clusters and a catalytic metal gettering layer (both not shown) for gettering unreacted catalytic metal clusters are formed in succession.

Figure 5B:
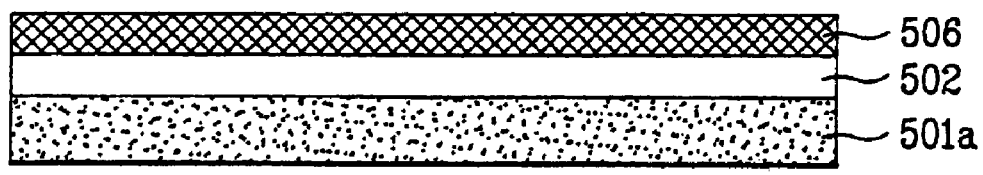

In FIG. 5B, the amorphous silicon layer 503 is crystallized into a polycrystalline silicon layer 506 by the foregoing crystallization process.

Figure 5C:
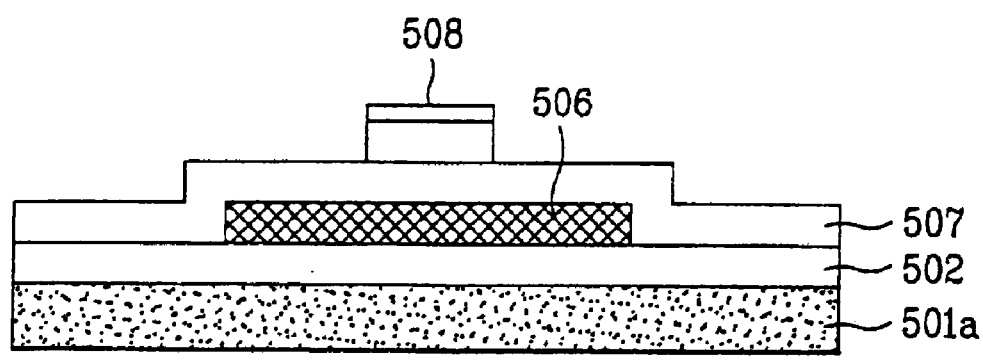

As shown in FIG. 5C, the polycrystalline silicon layer is patterned to form an island shape for using as a channel of a thin film transistor. A gate insulating film 507 is formed of silicon nitride or silicon oxide on the entire exposed surface of the first substrate 501a including the island shape of the polycrystalline silicon layer 506. Thereafter, AlNd and Mo are stacked on the gate insulating film 507 in succession and patterned to form a gate electrode 508 and a gate line (not shown) of the thin film transistor.

Figure 5D:
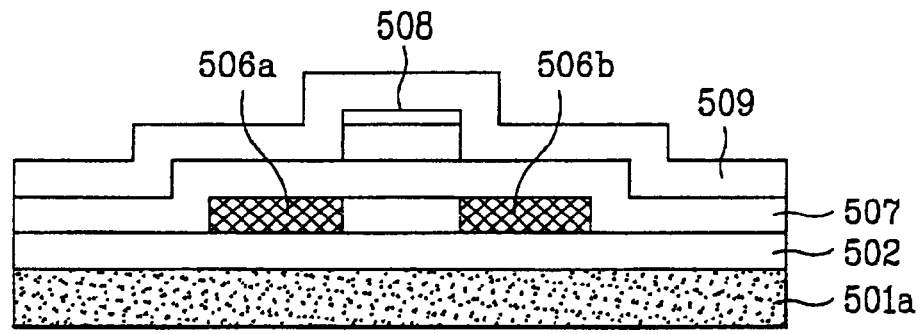

Referring to FIG. 5D, $n^+$-type ions are injected into the polycrystalline silicon layer 506 using the gate electrode 508 as an ion injection mask, thereby forming a source region 506a and the drain region 506b. Then, an interlayer insulating film 509 is formed on the entire exposed surface including the gate electrode 508 and the gate line.

Figure 5E:
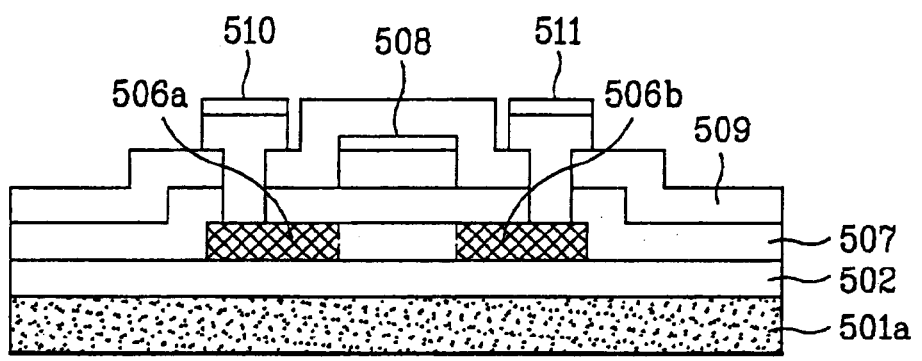

Referring to FIG. 5E, the interlayer insulating film 509 and the gate insulating film 507 are removed in succession to form via-holes exposing a part of each of the source region 506a and the drain region 506b of the $n^+$-type ion doped polycrystalline silicon layer 506. AlNd and Mo are stacked in succession to fill the via-holes and patterned to form a source electrode 510 and a drain electrode 511 of the thin film transistor.

Figure 5F:
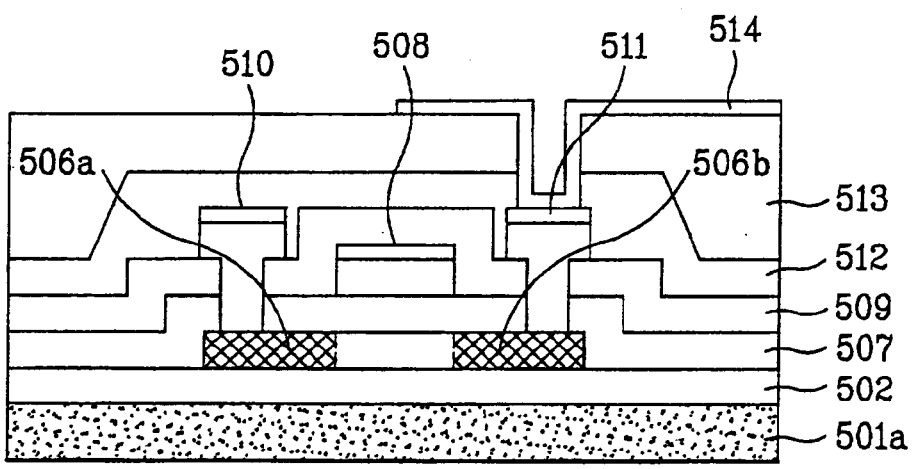

Referring to FIG. 5F, a first protection film 512 of silicon nitride and a second protection film 513 of benzocyclobutene (BCB) are stacked on the entire exposed surface including the source electrode 510 and the drain electrode 511 in succession, and patterned to form a contact hole to expose the drain electrode 511.

Then, a transparent conductive film of indium tin oxide (ITO), for an example, is formed on the entire exposed surface of the insulating substrate 501a including the contact hole, and patterned to form a pixel electrode 514 connected to the drain electrode 511 through the contact hole.

Then, a liquid crystal layer (not shown) is formed between the first substrate 501a and a second substrate (not shown) to complete a process of fabricating a liquid crystal display in accordance with the first embodiment of the present invention.

In this instance, the second substrate has a color filter layer formed for displaying colors, and a black matrix pattern for preventing light leakage through the thin film transistor, the gate line, and the data line on the first substrate 501a. The second substrate also has a common electrode for applying an electrical signal to the liquid crystal layer with the pixel electrode 514.

Thus, the method of fabricating a liquid crystal display by using the method of fabricating a thin film transistor and the method of forming polycrystalline silicon in accordance with the first embodiment of the present invention has the following advantages.

Amorphous silicon is crystallized with gettering Ni, Ni atoms migrate to the amorphous silicon layer in an amount fewer than the deposited amount because of the catalytic metal gettering layer on the amorphous silicon layer and the nuclei forming sites. Thus, a good quality polycrystalline silicon is obtained with a grain size larger than the related art and fewer stacking faults.

Moreover, by removing a layer having pairs of the gettered catalytic metal atoms and phosphorous ion, an interface characteristic between the silicon oxide film and the polycrystalline silicon is improved. As a result, performance of the thin film transistor and the liquid crystal display is improved.

In a second embodiment of the present invention, a heavily doped n-type (an $n^+$-layer) layer (i.e., a heavy phosphorous doped layer) is formed under the lower surface of amorphous silicon, acting as a catalytic metal gettering layer. According to this embodiment, a part of nickel atoms used as the catalytic metal in crystallization of the amorphous silicon immigrate to the layer having phosphorous heavily doped therein (i.e., a sink layer for gettering catalytic metal), such that an amount of nickel fewer than deposited amount makes reaction with the amorphous silicon in the amorphous silicon to form silicide $NiSi_2$.

More specifically, FIGS. 6A to 6D illustrate cross-sections showing a method of forming polycrystalline silicon in accordance with the second embodiment of the present invention. FIGS. 7A to 7E illustrate cross-sections showing a method of fabricating a thin film transistor by using the method of forming polycrystalline silicon in accordance with the second embodiment of the present invention.

Figure 6A:
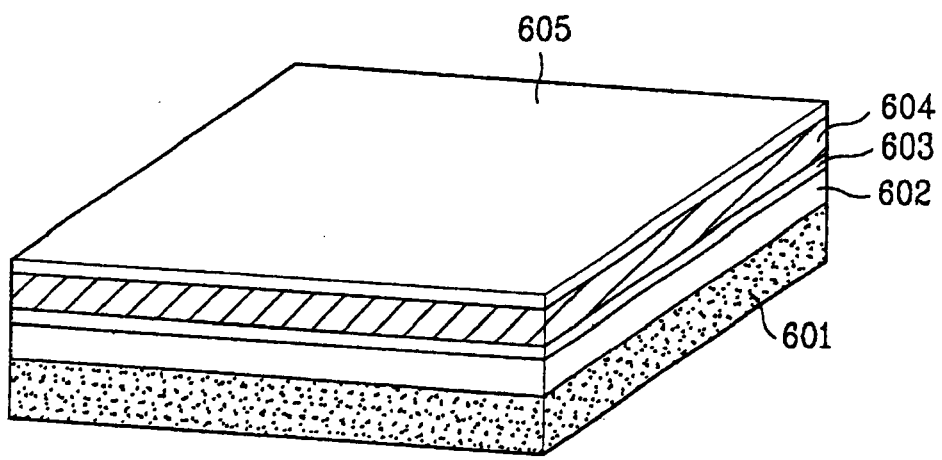
FIGS. 6A to 6D illustrate cross-sections showing a method of forming polycrystalline silicon in accordance with a second embodiment of the present invention.
Figure 6B:
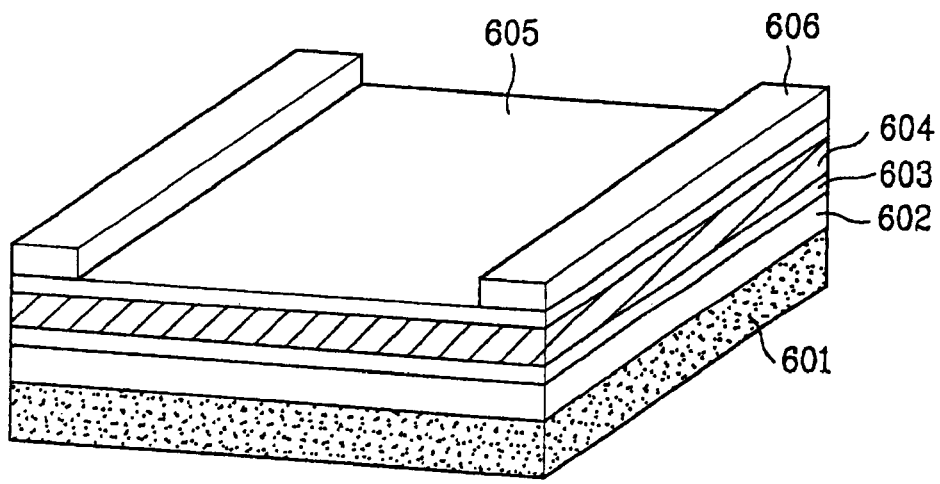

Initially referring to FIG. 6A, after a buffer layer 602 of silicon oxide ($SiO_2$) or silicon nitride ($SiN_2$) is formed on a glass substrate 601 by chemical vapor deposition (CVD), a catalytic metal gettering layer 603 is formed on the buffer layer 602. The catalytic metal gettering layer 603 is formed of amorphous silicon with heavy dopants of phosphorous ions, or an $n^+$-type (or a heavily doped n-type ions) amorphous silicon layer formed from $SiH_4$ and $PH_3$. The catalytic metal gettering layer 603 serves as a sink layer for gettering unreacted catalytic metal clusters.

One side of the buffer layer 602 serves to prevent impurities in the glass substrate 601 from diffusing into the amorphous silicon layer, which is the active region. The other side of the buffer layer 602 cuts off a heat flow into the glass substrate 601 in the following crystallization.

Thereafter, an amorphous silicon (a-Si:H) layer 604 is formed on the catalytic metal gettering layer 603 from a mixture gas of $SiH_4$ and $H_2$ by PECVD. A plurality of catalytic metal clusters 605 is formed on the amorphous silicon layer 604 by sputtering. The catalytic metal clusters 605 may be formed of one of chromium (Cr), palladium (Pd), nickel (Ni), and platinum (Pt). A thickness of the catalytic metal clusters is less than a mono-layer, and an mount is greater than $1 \times 10^{18}$ atoms/$cm^3$.

Referring to FIG. 2B, a pair of electrodes 606 are formed at both ends of the catalytic metal clusters 605 for applying electric fields. The electrodes 606 may be formed of molybdenum or graphite.

Then, electric fields are applied to the electrodes 606 at the both ends of the catalytic metal clusters 605, while the glass substrate 601 is annealed to crystallize the amorphous silicon layer 604. For example, a voltage to the electrodes 606 is 10 to 500V/cm for 15 to 300 min., at an annealing temperature of 400 to 600° C.

Figure 6C:
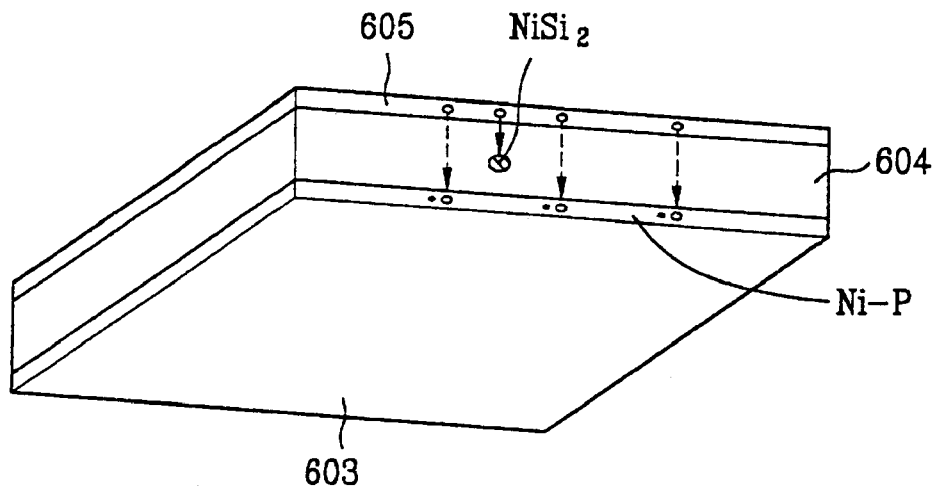
Figure 6D:
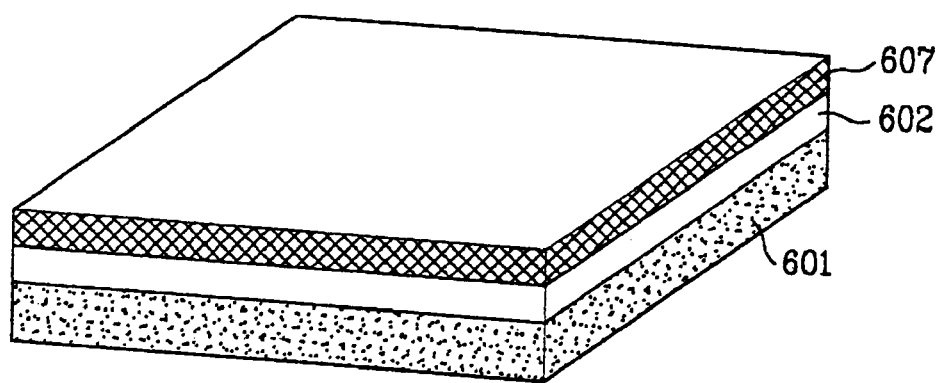

Referring to FIG. 6D, while the foregoing processes are progressed, the amorphous silicon layer 604 is crystallized into a polycrystalline silicon layer 607 by the FEMIC effect.

When annealing is carried out under the foregoing conditions, the catalytic metal clusters 605 in a solid phase diffuses into the amorphous silicon/flayer 604 to form nuclei forming sites of a metal silicide, and grains of the polycrystalline silicon start to grow. For an example, when nickel (Ni) is used as the catalytic metal clusters 605, nickel silicide ($NiSi_2$) is formed by the foregoing process.

That is, the metal silicide serves as a catalyst for crystallizing the amorphous silicon (i.e., crystallization nuclei). Due to the crystallization nuclei, the amorphous silicon is uniformly crystallized at a fast rate.

In the meantime, as shown in FIG. 6C, during the crystallization process, a part of the nickel atoms are diffused toward the catalytic metal gettering layer 603, to form pairs Ni—P with the phosphorous (P) in the catalytic metal gettering layer 603.

According to the foregoing reaction, an amount of nickel in the amorphous silicon layer 604 and in the polycrystalline silicon layer 607 and an amount of nickel in the catalytic metal gettering layer are saturated at a concentration equivalent to the nickel solubility at the foregoing crystallization temperature, so that the Ni amount in the polycrystalline silicon is maintained below $1 \times 10^{14}$ atoms/cm$^3$.

Nickel diffusion profiles in the initial crystallization, and crystallization are similar to FIGS. 3A and 3B, respectively.

The method of fabricating a thin film transistor by using the method of forming polycrystalline silicon in accordance with the second embodiment of the present invention will be explained.

Figure 7A:
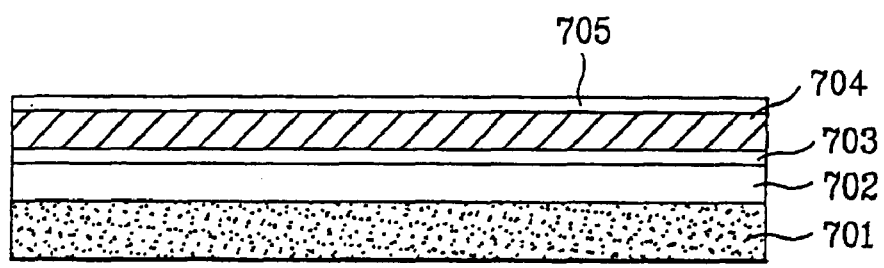
FIGS. 7A to 7E illustrate cross-sections showing a method of fabricating a thin film transistor by using the method of forming polycrystalline silicon in accordance with the second embodiment of the present invention.

Referring to FIG. 7A, a buffer layer 702 of silicon oxide ($SiO_2$) is formed on a glass substrate 701, and a catalytic metal gettering layer 703 is formed on the buffer layer 702. The catalytic metal gettering layer 703 is formed of amorphous silicon with heavy dopants of phosphorous ions, or an n$^+$-type (heavily doped n-type) amorphous silicon layer formed by using gases, such as $SiH_4$ and $PH_3$.

Next, an amorphous silicon layer (a-Si:H) 704 is formed on the catalytic metal gettering layer 703 by CVD, and a plurality of catalytic metal clusters 705 are sputtered on the amorphous silicon layer 704. The catalytic metal clusters 705 may be formed of one of chromium (Cr), palladium (Pd), nickel (Ni), and platinum (Pt). For example, a thickness of the catalytic clusters is less than a mono-layer, and an amount is greater than $1 \times 10^{18}$ atoms/cm$^3$.

Figure 7B:
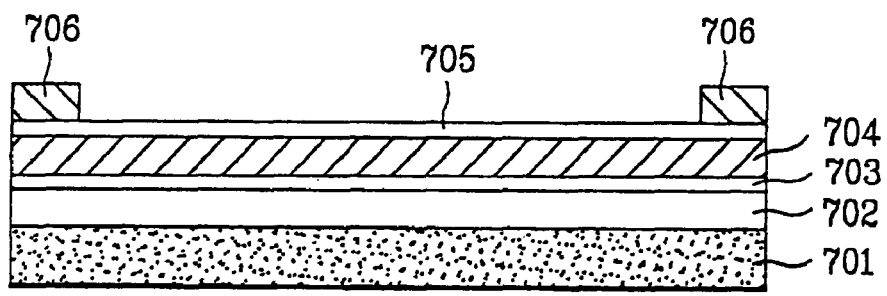

Then, referring to FIG. 7B, a pair of electrodes 706 are formed at both ends of the catalytic metal clusters 705 for applying electric fields. The electrodes 706 may be formed of molybdenum (Mo) or graphite.

Thereafter, electric fields are applied to the electrodes 706, while the substrate 701 is heat-treated to crystallize the amorphous silicon layer 704. For example, a voltage to the electrodes 706 is 10 to 500V/cm for is 15 to 300 min., at a heat-treatment temperature is 400 to 600° C.

Figure 7C:
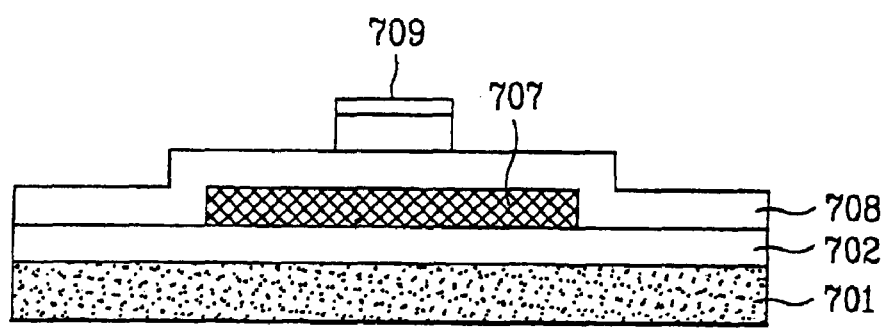

Referring to FIG. 7C, after crystallizing the amorphous silicon layer 704 into a polycrystalline silicon layer 707 through the foregoing process, the polycrystalline silicon layer 707 is patterned to form an island shape. Then, a gate insulating film 708 is formed of silicon oxide film ($SiO_2$) or silicon nitride on the entire exposed surface of the insulating substrate 701, including the polycrystalline silicon layer 707 of the island shape.

AlNd and Mo are stacked on the gate insulating film 708 by sputtering in succession, and patterned to form a bilayered gate electrode 709.

Figure 7D:
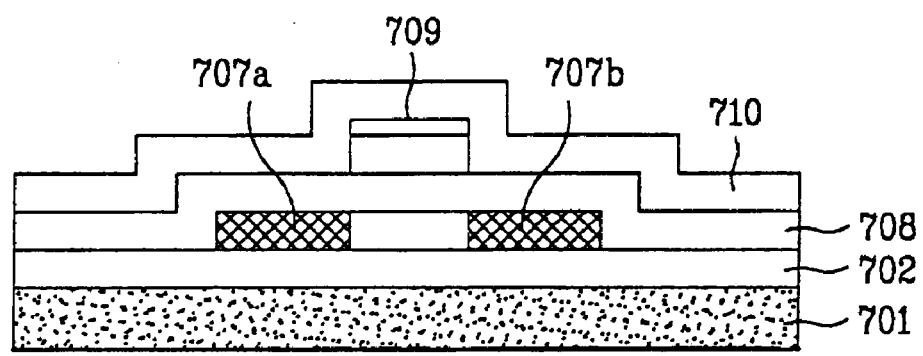

Referring to FIG. 7D, n$^+$-type ions are injected to the polycrystalline silicon layer 707 at both ends of the gate electrode 709 using the gate electrode 709 as a mask to form a source region 707*a* and a drain region 707*b*. Then, an active region is enabled at a temperature lower than the crystallization temperature. An interlayer insulating film 710 is then formed on the entire exposed surface of the insulating substrate 701 including the gate electrode 709.

Figure 7E:
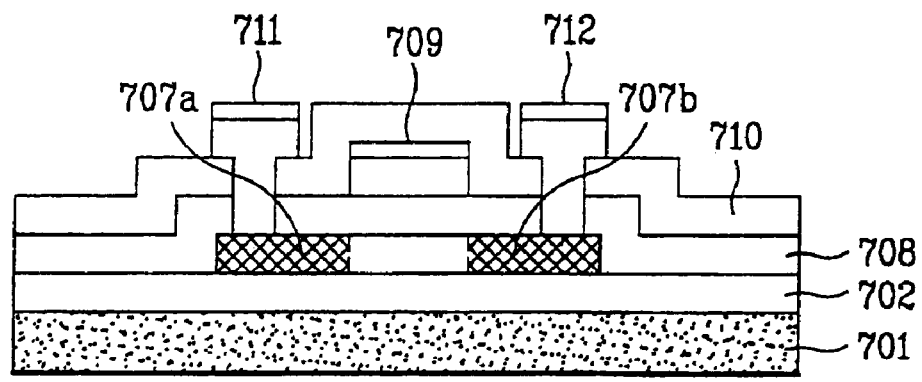

Referring to FIG. 7E, the interlayer insulating film 710 and the gate insulating film 708 are etched to form via-holes so as to expose the source and drain regions of the n$^+$-type ion doped polycrystalline silicon layer 707. AlNd and Mo are stacked in succession to fill the via-holes. Then, the stacked AlNd and Mo are patterned, to form a source electrode 711 and a drain electrode 712, thereby completing a process of fabricating a thin film transistor by using the method of forming polycrystalline silicon in accordance with a second embodiment of the present invention.

A method of fabricating a liquid crystal display by using the method of fabricating a thin film transistor and the method of forming polycrystalline silicon in accordance with the second embodiment of the present invention will be explained. FIGS. 8A to 8F illustrate cross-sections showing a method of fabricating a liquid crystal display by using the method of forming polycrystalline silicon in accordance with the second embodiment of the present invention.

Figure 8A:
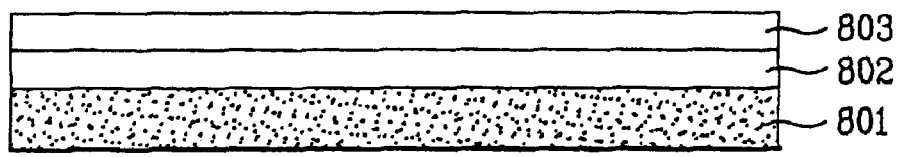
FIGS. 8A to 8F illustrate cross-sections showing a method of fabricating a liquid crystal display by using the method of forming polycrystalline silicon in accordance with the second embodiment of the present invention.

Referring to FIG. 8A, after a buffer layer 802 of silicon oxide is formed on a first substrate 801, an amorphous silicon layer 803 is formed on the buffer layer 802 by PECVD from a mixture gas of $SiH_4$ and $H_2$. A plurality of catalytic metal clusters are formed on the surface of the amorphous silicon layer 803. A catalytic metal gettering layer is formed under the lower surface of the amorphous silicon layer 803 for gettering the unreacted catalytic metal clusters.

Figure 8B:
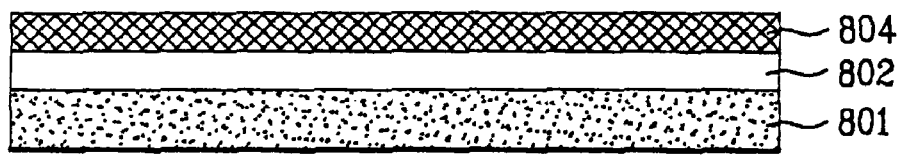

Then, referring to FIG. 8B, the amorphous silicon layer 803 is crystallized into a polycrystalline silicon layer 804 by the foregoing crystallization process.

Figure 8C:
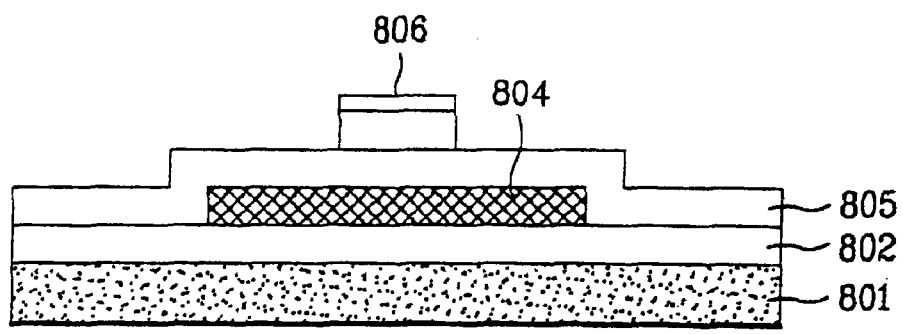

As shown in FIG. 8C, the polycrystalline silicon layer is patterned to have an island shape for using as a channel of the thin film transistor. After a gate insulating film 805 is formed of silicon nitride or silicon oxide on the entire exposed surface of the first substrate 801, including the island shape of the polycrystalline silicon layer 804. AlNd and Mo are stacked on the gate insulating film 805 in succession and patterned to form a gate electrode 806 and the gate line (not shown) of the thin film transistor.

Figure 8D:
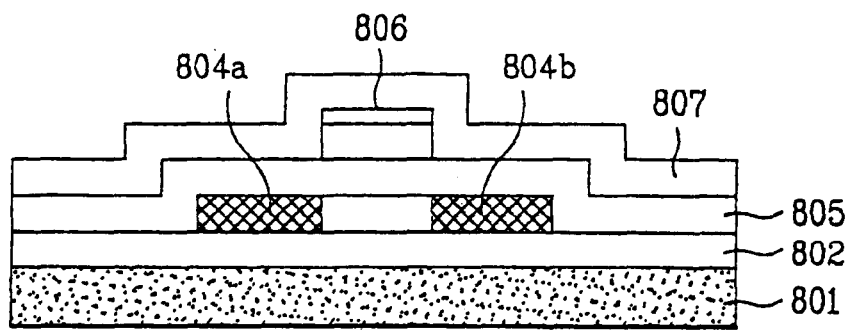

Referring to FIG. 8D, n$^+$-type ions are injected into the polycrystalline silicon layer 804 using the gate electrode 806 as an ion injection mask, to form a source region 804*a* and a drain region 804*b*. Then, an interlayer insulating film 807 is formed on the entire exposed surface, including the gate electrode 806 and the gate line.

Figure 8E:
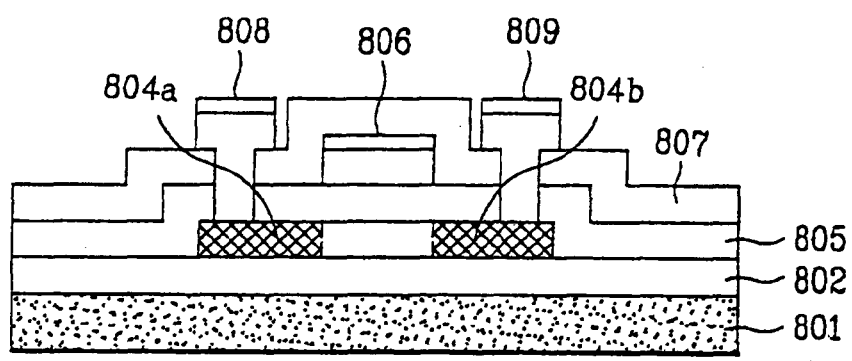

Referring to FIG. 8E, the interlayer insulating film 807 and the gate insulating film 805 are patterned in succession, to form via-holes exposing a part of each of the source region 804*a* and the drain region 804*b* in the n$^+$-type ion doped polycrystalline silicon layer 804. AlNd and Mo are stacked in succession to fill the via-holes and patterned to form a source electrode 808 and a drain electrode 809 of the thin film transistor.

Figure 8F:
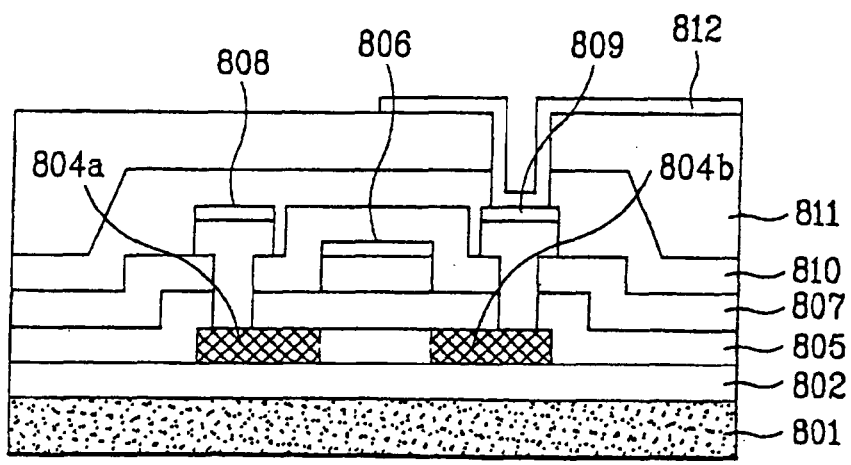

Referring to FIG. 8F, a first protection film 810 of silicon nitride and a second protection film 811 of benzocyclobutene (BCB) are stacked on the entire exposed surface including the source electrode 808 and the drain electrode 809 in succession, and patterned to form a contact hole exposing the drain electrode 809.

Then, a transparent conductive film of indium tin oxide (ITO), for an example, is formed on the entire exposed surface of the insulating substrate 801 including the contact hole, and patterned to form a pixel electrode 812 connected to the drain electrode 809 through the contact hole.

A liquid crystal layer (not shown) is formed between the first substrate 801 and a second substrate (not shown), to complete a process of fabricating a liquid crystal display in accordance with the second embodiment of the present invention.

In this instance, the second substrate has a color filter layer formed for displaying colors, and a black matrix pattern for preventing light leakage through the thin film transistor, the gate line, and the data line on the first substrate 801. The second substrate also has a common electrode for applying an electrical signal to the liquid crystal layer with the pixel electrode 812.

Thus, the method of fabricating a liquid crystal display by using the method of fabricating a thin film transistor and the method of forming polycrystalline silicon in accordance with the second embodiment of the present invention has the following advantages.

Phosphorus contained in the catalytic metal gettering layer getters the unreacted Ni atoms because migrated Ni atoms form N—P pairs with the phosphorus atoms. Thus, a charge neutralization is completed. Accordingly, in crystallizing amorphous silicon in the present invention, Ni atoms migrate to the amorphous silicon in an amount fewer than a deposited amount and form nuclei forming sites. Therefore, the amounts of Ni and $NiSi_2$ remained in the polycrystalline silicon are significantly reduced.

Further, since amounts of Ni and $NiSi_2$ in the active region is controlled by the gettering layer under the lower surface of the active region, a grain size of the polycrystalline silicon is increased when the amorphous silicon is crystallized by using a minute amount of Ni, and device characteristics, such as electron mobility, is improved.

Figure 9A:
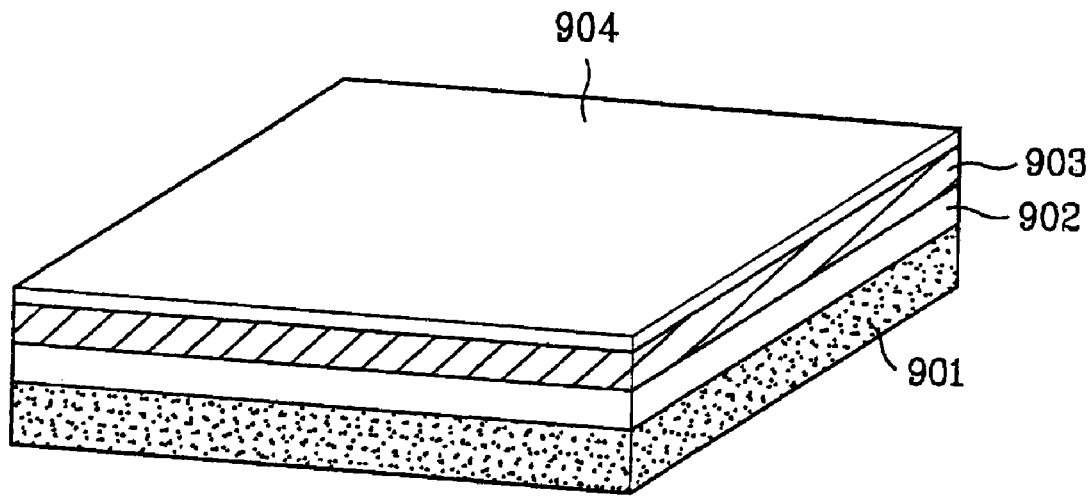
FIGS. 9A to 9D illustrate cross-sections showing a method of forming polycrystalline silicon in accordance with a third embodiment of the present invention.
Figure 9B:
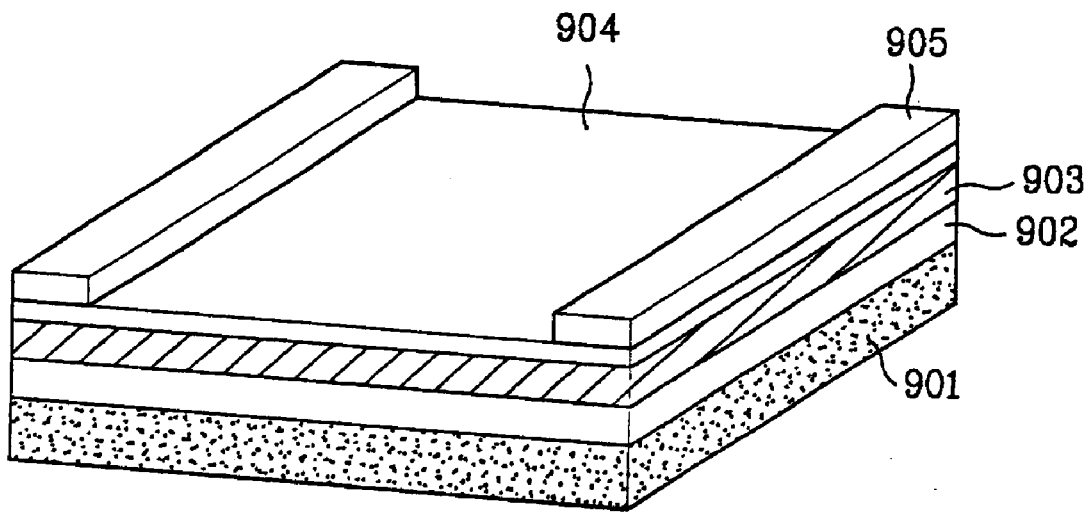
Figure 9C:
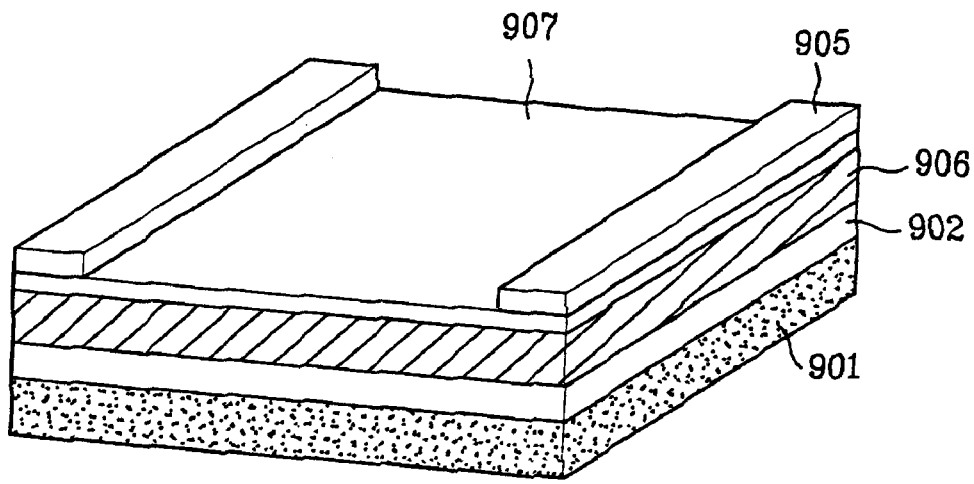

FIGS. 9A to 9C are cross-sectional views illustrating a method of forming polycrystalline silicon in accordance with a third embodiment of the present invention.

In FIG. 9A, a buffer layer 902 of silicon dioxide or silicon nitride is formed on a substrate 901 by CVD from a mixed gas of $SiH_4$ and $H_2$. The buffer layer 902 prevents impurities of the substrate from diffusing into an amorphous silicon layer. In addition, the buffer layer 902 stops a heat flow from the substrate during a heat-treatment. Thereafter, an amorphous silicon layer 903 is formed on the buffer layer 902. For example, PECVD may be used for forming the amorphous silicon layer 903. A plurality of catalytic metal clusters 904 are formed on the amorphous silicon layer 903 by sputtering. As an example, one of chromium, palladium, nickel, and platinum may be selected for the catalytic metal clusters 904. A thickness of catalytic metal clusters 904 is less than a mono-layer and a concentration is greater than $1\times10^{18}$ atoms/$cm^3$.

A pair of electrodes 905, such as molybdenum and graphite are formed on the catalytic metal clusters 904 for applying electric fields to the catalytic metal clusters 904, as shown in FIG. 9B. For example, the applied electric fields are 10 to 500 V/cm for 10 to 300 min. At the same time, the substrate 901 including the amorphous silicon layer 903 is heat-treated at a temperature of 400 to 600° C. Thus, the amorphous silicon layer 903 is transformed into a polycrystalline silicon layer 906 as shown in FIG. 9C.

Figure 9D:
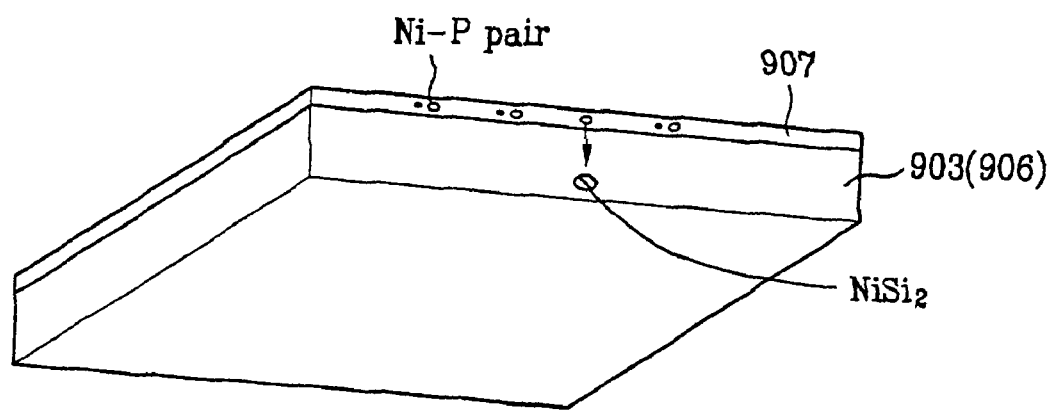

As shown in FIG. 9D, while the heat-treating is in progress under the above conditions, the catalytic metal clusters 904 in a solid phase diffuse into the amorphous silicon layer 903 and form a metal silicide, such as nickel silicide ($NiSi_2$) with nickel. The metal silicide acts as a catalyst to be nuclei forming sites of the metal silicide, so that grains of the polycrystalline silicon begin to grow. Due to the crystallization nuclei, the amorphous silicon is uniformly crystallized at a fast rate.

FIG. 9C illustrates a catalytic metal gettering layer 907 formed on the polycrystalline silicon 906. Since there is unreacted catalytic metal clusters in the previous process, they should be removed from the polycrystalline silicon layer 902. The remaining catalytic metal clusters in the polycrystalline silicon layer 902 cause a problem such as a leakage current. In order to remove the unreacted catalytic metal clusters, a catalytic metal gettering layer 907, such as an $n^+$-type ion (i.e., phosphorous ion) doped amorphous silicon layer, is formed on the polycrystalline silicon layer 906. By annealing the substrate 901 including the polycrystalline silicon layer 906 and the catalytic metal gettering layer 907, the unreacted catalytic metal clusters migrate to the catalytic metal gettering layer 907 due to a concentration gradient. Nickel atoms are paired with n-type ions at the catalytic metal gettering layer 907. Therefore, the unreacted catalytic metal clusters are removed by etching the catalytic metal gettering layer 907 in the following process.

It will be apparent to those skilled in the art that various modifications and variations can be made in the method of forming polycrystalline silicon of the present invention without departing from the spirit or scope of the inventions. Thus, it is intended that the present invention covers the modifications and variations of this invention provided they come within the scope of the appended claims and their equivalents.

What is claimed is:

1. A method for forming polycrystalline silicon from amorphous silicon, comprising:

forming an amorphous silicon layer on a substrate;

forming a plurality of catalytic metal clusters on the amorphous silicon layer;

forming a catalytic metal gettering layer adjacent to the amorphous silicon layer; and heat-treating the substrate including the amorphous silicon layer to transform the amorphous silicon layer into a polycrystalline silicon layer, wherein unreacted catalytic metal clusters migrate to the catalytic metal gettering layer in a direction perpendicular to the substrate.

2. The method of claim 1, further comprising forming a pair of electrodes on the catalytic metal clusters.

3. The method of claim 2, further comprising applying electric fields to the electrodes while the substrate is heat-treated.

4. The method of claim 3, wherein the applied electric fields is 10 to 500 V/cm for 15 to 300 minutes.

5. The method of claim 2, wherein the electrodes are formed of molybdenum or graphite.

6. The method of claim 1, further comprising forming a buffer layer between the substrate and the amorphous silicon layer, the buffer layer preventing impurities of the substrate from diffusing into the amorphous silicon layer and stopping a heat flow into the substrate during the heat-treatment.

7. The method of claim 6, wherein the buffer layer is formed of silicon nitride or silicon oxide.

8. The method of claim 1, wherein the catalytic metal gettering layer is formed of an n$^+$-type amorphous silicon.

9. The method of claim 1, wherein the substrate is formed of glass.

10. The method of claim 1, wherein the catalytic metal gettering layer is formed on the amorphous silicon layer.

11. The method of claim 1, wherein the catalytic metal gettering layer is formed beneath the amorphous silicon layer.

12. The method of claim 1, wherein the catalytic metal clusters has a concentration of about $1\times10^{18}$ atoms/cm$^3$.

13. The method of claim 1, wherein the catalytic metal clusters are one or several elements selected from the group consisting of chromium, palladium, nickel, and platinum.

14. The method of claim 1, wherein the substrate is heat-treated at a temperature of 400 to 600° C.

15. The method of claim 1, wherein the catalytic metal clusters are formed by sputtering.

16. The method of claim 1, further comprising removing the catalytic metal gettering layer including the unreacted catalytic metal clusters from the substrate.

17. A method of forming polycrystalline silicon from amorphous silicon, comprising:

forming an amorphous silicon layer on a substrate;

forming a plurality of catalytic metal clusters on the amorphous silicon layer;

simultaneously applying electric fields to the catalytic metal clusters and first heat-treating the substrate to transform the amorphous silicon layer into a polycrystalline silicon layer;

forming a catalytic metal gettering layer on the polycrystalline silicon layer;

second heat-treating the substrate including the polycrystalline silicon layer to getter unreacted catalytic metal clusters migrated at the catalytic metal gettering layer; and removing the catalytic metal gettering layer including the unreacted catalytic metal clusters.

18. The method of claim 17, further comprising forming a pair of electrodes on the catalytic metal clusters.

19. The method of claim 17, wherein the catalytic metal clusters has a concentration of about $1\times10^{18}$ atoms/cm$^3$.

20. The method of claim 17, wherein the applied electric fields is 10 to 500 V/cm for 15 to 300 minutes.

21. The method of claim 17, wherein the substrate is heat-treated at a temperature of 400 to 600° C.

22. The method of claim 17, wherein the catalytic metal clusters are formed by sputtering.

* * * * *